(12) United States Patent
Tsuru

(10) Patent No.: US 6,544,035 B2
(45) Date of Patent: Apr. 8, 2003

(54) SEMICONDUCTOR MANUFACTURING APPARATUS

(75) Inventor: Kiyohiro Tsuru, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/969,690

(22) Filed: Oct. 3, 2001

(65) Prior Publication Data

US 2002/0102510 A1 Aug. 1, 2002

(30) Foreign Application Priority Data

Oct. 10, 2000 (JP) ........................................ 2000-309533

(51) Int. Cl.[7] ................................................ A21B 1/40
(52) U.S. Cl. ........................ 432/247; 432/253; 219/405
(58) Field of Search ............................. 432/4, 20, 102, 432/209, 247, 249, 251, 253, 254.1, 254.2; 219/390, 405; 392/416, 418

(56) References Cited

U.S. PATENT DOCUMENTS 4,859,832 A * 8/1989 Uehara et al. ............... 219/405
4,924,073 A * 5/1990 Chiba ........................... 219/411
5,414,244 A * 5/1995 Imahashi ..................... 432/209

* cited by examiner

Primary Examiner—Gregory Wilson
(74) Attorney, Agent, or Firm—Adam & Wilks

(57) ABSTRACT

Disclosed is an apparatus that suppresses changes in a temperature distribution in a wafer caused by changes in the light transmittance of a process tube of a lamp annealing furnace. A transmission type sensor including a light emitting section and a light receiving section is arranged so that a process tube is sandwiched between the light emitting section and the light receiving section. The transmission type sensor measures the light transmittance of the process tube, so that it becomes possible to determine when the process tube needs changing. Also, by using a plurality of transmission type sensors and performing feedback control of power of lamps according to measurement results of the transmission type sensors, it becomes possible to suppress changes in the temperature distribution in a wafer.

5 Claims, 1 Drawing Sheet

SEMICONDUCTOR MANUFACTURING APPARATUS

BACKGROUND OF THE INVENTION

1. Field of the Invention

The present invention relates to a temperature control of a lamp annealing furnace (optical heating apparatus), which is used for activating an ion implantation layer; reflowing phosphorus silicate glass; annealing metal; forming an ohmic contact between Si and metal; and the like during processing of a semiconductor wafer.

2. Description of the Related Art

A conventional lamp annealing furnace uses a process tube made of quartz glass. A semiconductor wafer to be subjected to heat treatment is placed inside the process tube and is heat-treated using light emitted from lamps (such as tungsten-halogen lamps) provided in the lamp annealing furnace. The lamps are grouped into two sets that are respectively arranged so as to be spaced apart from an upper surface and a lower surface of the process tube or to face a right surface and a left surface thereof.

Various techniques have been conventionally used to improve uniformity of temperature distribution in a wafer, which is under heat-treated. For instance, the lamps are arranged in a lattice manner or in a honeycomb manner. Also, a lamp power of each lamp is controlled or an area in which the lamps are arranged is divided into several zones and the lamp power control is performed with respect to each zone. Further, lamps having different wattages are used as the lamps of the lamp annealing furnace.

When the temperature in the lamp annealing furnace is controlled using these conventional techniques, if the transmittance of the quartz glass tube stays constant, the distribution of heat supplied from the lamps to a wafer may be reproducible. As a result, the temperature distribution of a wafer that is being processed is also reproducible. However, impurities emitted from a wafer during the heat treatment cause a clouding of the quartz glass tube. In particular, the reflow of phosphorus silicate glass causes the conspicuous clouding of the quartz glass tube because the phosphorus adheres to the surface of the quartz glass tube. Clouding of the quartz glass does not evenly occur and gets worse across the entire surface of the quartz glass tube, so that the distribution of heat supplied from the lamps to a wafer varies with time and the uniformity of the temperature distribution in the wafer is reduced.

To solve this problem, there have been conventionally used various techniques. With a first conventional technique, changing of a quartz glass tube is periodically performed. With a second conventional technique, a plate made of quartz glass is inserted into a space between an inner surface of a quartz glass tube and a wafer to be processed, and changing of such a quartz glass plate is periodically performed. With a third conventional technique, a quartz glass tube having transparency is changed into a frosted glass tube in order to suppress changes in transmittance thereof due to the clouding. Even with these techniques, however, it is impossible to prevent the reduction in uniformity of temperature distribution in a wafer caused by the clouding of a quartz glass tube.

SUMMARY OF THE INVENTION

According to the present invention, a transmission type sensor including a light emitting section and a light receiving section is arranged so that a quartz glass tube, in which heat treatment of a wafer is performed, is sandwiched between the light emitting section and the light receiving section. The transmission type sensor detects a change in the intensity of light that is emitted from the light emitting section, passes through the quartz glass tube, and is received by the light receiving section. A degree of change in the light intensity detected by the transmission type sensor is measured and a light transmittance of the quartz glass tube is determined using the measured degree of change in the light intensity. By using a plurality of transmission type sensors and by controlling balance among output power of lamps according to the light transmittance of the quartz chamber determined based on the detection result of each transmission type sensor, it becomes possible to improve the uniformity of temperature distribution in a wafer during heat treatment.

DETAILED DESCRIPTION OF THE PREFERRED EMBODIMENT

Figure 1:
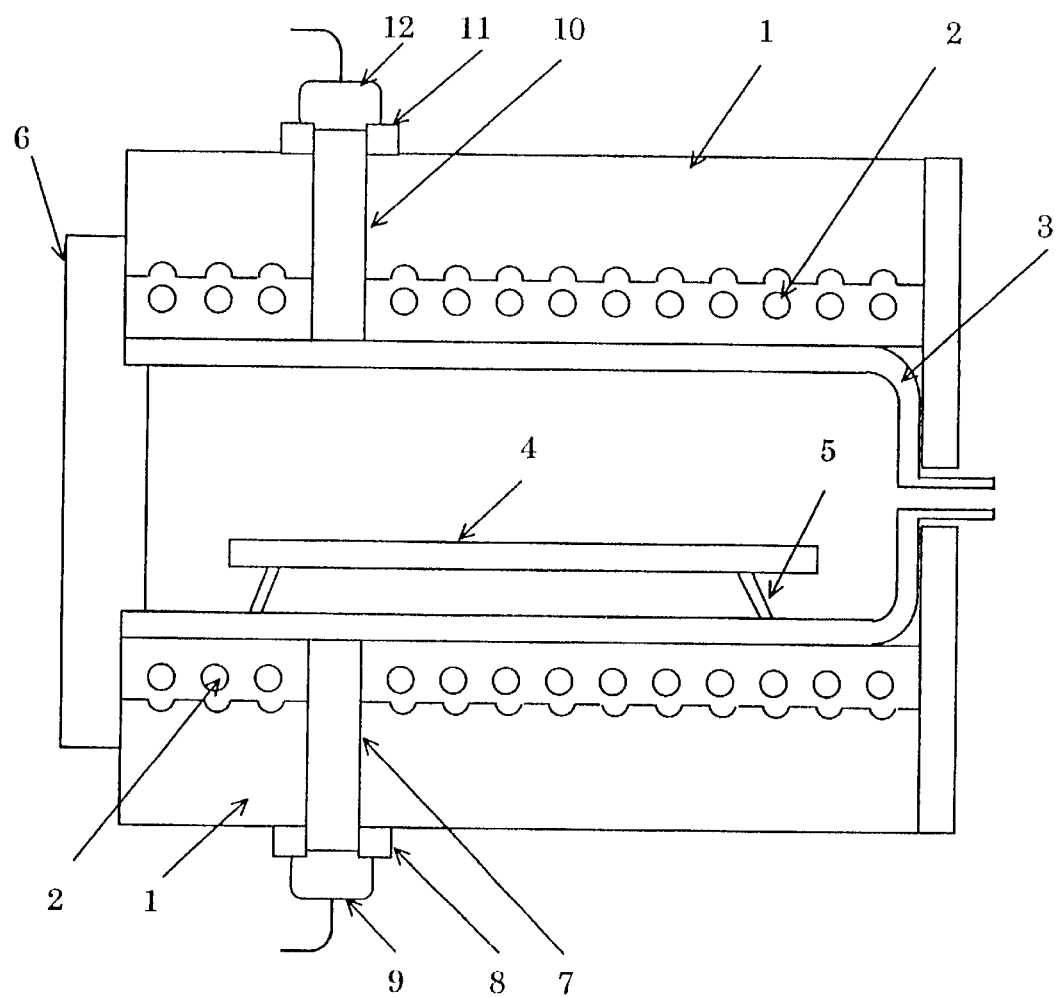
FIG. 1 is a cross sectional view of a lamp annealing furnace of the present invention.

An embodiment of the present invention is described in detail below with reference to the drawing.

FIG. 1 is a vertical cross-sectional view showing a state where a light emitting section 9 and a light receiving section 12 of a transmittance type sensor are provided for a lamp annealing furnace of the present invention. The lamp annealing furnace has a construction where two sets of a flat plate reflection surface 1 and lamps 2 are respectively arranged so as to be spaced from each other in an upper portion and a lower portion of the lamp annealing furnace or in a right portion and a left portion thereof, a process tube 3 is arranged so as to be sandwiched between these sets, a susceptor 5 on which a wafer 4 is mounted is placed in the process tube 3, and a processing space is formed by the process tube 3 and a lid 6.

There is provided an opening in one side surface of the process tube 3. This opening is welded to one end of a hollow tube 7 and the other end of this hollow tube 7 is connected to the light emitting section 9 of the transmission type sensor via a fixture 8.

There is also provided another opening in the other side surface of the process tube 3. This opening is welded to one end of a hollow tube 10 and the other end of this hollow tube 10 is connected to the light receiving section 12 of the transmission type sensor via a fixture 11. With this construction, the light receiving section 12 receives light emitted from the light emitting section 9.

The light intensity of the received light varies depending on the light transmittance (light transmissivity) of the process tube 3. The process tube 3 is usually made of quartz glass and is transparent. If there occurs no degradation (such as clouding) of the process tube 3 during heat treatment of the wafer 4, the light transmittance (light transmissivity) of the process tube 3 stays almost constant. In practice, however, impurities (such as phosphorus and boron) are liberated during the heat treatment, and therefore there occurs the clouding of the process tube 3.

This clouding causes changes in the light transmittance of the process tube 3, so that the intensity of light received by the light receiving section 12 of the transmission type sensor also changes in accordance with the changes in the light transmittance of the process tube 3.

If the light transmittance changes, a quantity of heat reaching the wafer 4 to be subjected to the heat treatment also changes even if lamp power stay constant. This causes changes in the temperature of the semiconductor wafer. To prevent such changes in the temperature of the wafer 4 resulting from the reduction in the light transmittance, feedback control of the lamp power is performed according to the changes in the light transmittance of the process tube 3. If the light transmittance is significantly reduced, however, the output power of the lamps excessively increases. Also, if the light transmittance of the process tube 3 evenly changes due to the clouding thereof across the entire surface of the process tube 3, there occurs no change in the distribution of the heat supplied from the lamps 2 to the wafer 4. In practice, however, the clouding of the process tube 3 does not evenly occur and get worse across the entire surface of the process tube 3, so that there occur changes in the distribution of heat supplied from the lamps 2 to the wafer 4. As a result, the uniformity of the temperature distribution in the wafer 4 is reduced.

To prevent such a reduction in the uniformity of the temperature distribution in the wafer 4, changing of the process tube 3 is performed. If the light transmittance is reduced due to the clouding of the process tube 3, the intensity of light received by the light receiving section 12 of the transmission type sensor is also reduced. Therefore, by setting a threshold value for the light intensity and by comparing the intensity of the received light with the threshold value, it becomes possible to determine when the process tube 3 needs changing. That is, if the intensity of received light falls below the threshold value, the changing of the process tube 3 is performed.

Also, to improve the uniformity of the temperature distribution in the wafer 4, the lamps 2 are arranged in a lattice manner or in a honeycomb manner. Also, the lamp power of each lamp 2 is controlled or an area in which the lamps 2 are arranged is divided into several zones and the lamp power control is performed with respect to each zone. Further, lamps having different wattages are used as the lamps 2. However, control conditions applied to the lamps 2 are determined by assuming that the light transmittance of the process tube 3 does not change. That is, the control conditions are determined according to a distribution pattern of the light transmittance of the process tube 3 at a given point in time. In this case, no thought is given to the changes in the light transmittance due to the clouding of the process tube 3 caused by the heat treatment of the wafer 4. Therefore, the distribution of heat supplied to the wafer 4 changes and thus there occur changes in the temperature distribution in the wafer 4. As a result, the uniformity of the temperature distribution is reduced. To maintain the uniformity of the temperature distribution in the wafer 4, a plurality of transmission type sensors that each include a light emitting section and a light receiving section may be arranged in the lamp annealing furnace. In this case, the feedback control of lamp power is performed according to information obtained by these sensors that shows how the clouding of the process tube 3 occurs.

With this construction, there may be cases where some transmission type sensors are arranged at positions where light traveling between their light emitting sections and light receiving sections is blocked by the wafer and other transmission type sensors are arranged at positions where light traveling between their light emitting sections and light receiving sections is not blocked. The transmission type sensors arranged at the positions where the traveling light is blocked by the wafer start to measure the intensity of light at the point in time when the wafer is discharged from the process tube. On the other hand, the transmission type sensors arranged at the positions where the traveling light is not blocked by the wafer measure the intensity of light even while the wafer is being placed in the process tube.

As described above, according to the present invention, there are detected changes in the light transmittance of a process tube used in a lamp annealing furnace. This makes it possible to determine when the process tube needs changing and to maintain the temperature of a wafer within a predetermined range during heat treatment. Also, by performing the feedback control of lamp power according to the light transmittance in each portion of the process tube, it becomes possible to maintain a predetermined degree of uniformity of temperature distribution in a wafer during heat treatment.

What is claimed is:

1. A lamp annealing furnace comprising:
   a quartz glass tube for performing heat treatment of a wafer;
   a transmission type sensor having a light emitting section and a light receiving section that are arranged so that the quartz glass tube is sandwiched therebetween, the transmission type sensor being operative to detect the intensity of light passing through the quartz glass tube using the light emitting section and the light receiving section;
   means for measuring a degree of change in the light intensity detected by the transmission type sensor; and
   means for determining a light transmittance of the quartz glass tube using the measured degree of change in the light intensity.

2. A lamp annealing furnace comprising:
   a quartz glass tube for performing heat treatment of a wafer is performed;
   a transmission type sensor having a light emitting section and a light receiving section that are arranged so that the quartz glass tube is sandwiched therebetween, the transmission type sensor being operative to detect the intensity of light passing through the quartz glass tube using the light emitting section and the light receiving section;
   means for measuring a degree of change in the light intensity detected by the transmission type sensor;
   means for determining a light transmittance of the quartz glass tube using the measured degree of change in the light intensity; and
   means for determining whether the quartz glass tube needs changing by comparing the determined light transmittance of the quartz glass tube with a threshold value.

3. A lamp annealing furnace comprising:
   a quartz glass tube for performing heat treatment of a wafer;
   lamps for applying heat to the wafer;
   a plurality of transmission type sensors, each sensor having a light emitting section and a light receiving section that are arranged so that the quartz glass tube is sandwiched therebetween, each transmission type sensor corresponding to one portion of the quartz glass tube and being operative to detect the intensity of light passing through the corresponding portion of the quartz glass tube using the light emitting section and the light receiving section;
   means for measuring a degree of change in the light intensity detected by each transmission type sensor;

means for determining a light transmittance in each portion of the quartz glass tube using the measured change degree; and means for adjusting balance among output power of the lamps according to the determined light transmittance in each portion of the quartz glass tube.

4. A lamp annealing furnace comprising: a quartz glass tube having a given light transmissivity for receiving therein during use of the furnace a wafer which is to be heat treated; an array of lamps for applying heat energy to the wafer to thereby heat treat the wafer; at least one light emitting section for emitting and directing light through the quartz glass tube; at least one light receiving section positioned to receive light which is emitted by the at least one light emitting section and which passes through the quartz glass tube for detecting therefrom the intensity of light passing through the quartz glass tube; and means for determining, based on the detected light intensity, a change in light transmissivity of the quartz glass tube occurring during heat treatment of the wafer.

5. A lamp annealing furnace according to claim 4; including a plurality of light emitting sections and a plurality of corresponding light receiving sections.

* * * * *